United States Patent
Calubayan et al.

(10) Patent No.: US 11,626,286 B1
(45) Date of Patent: Apr. 11, 2023

(54) CUSTOM PHOTOLITHOGRAPHY MASKING VIA PRECISION DISPENSE PROCESS

(71) Applicant: Rockwell Collins, Inc., Cedar Rapids, IA (US)

(72) Inventors: Jenny Calubayan, Cedar Rapids, IA (US); Richard Korneisel, Cedar Rapids, IA (US); Nathaniel P. Wyckoff, Marion, IA (US); Brandon C. Hamilton, Marion, IA (US); Kyle B. Snyder, Marion, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 326 days.

(21) Appl. No.: 17/002,605

(22) Filed: Aug. 25, 2020

(51) Int. Cl.
| | | |
|---|---|---|
| *G03F 7/00* | (2006.01) | |
| *G03F 7/22* | (2006.01) | |
| *H01L 21/02* | (2006.01) | |
| *G03F 1/00* | (2012.01) | |
| *G03F 9/00* | (2006.01) | |
| *G03F 7/20* | (2006.01) | |
| *H01L 21/027* | (2006.01) | |

(52) U.S. Cl.
CPC ............ *H01L 21/0274* (2013.01); *G03F 1/00* (2013.01); *G03F 7/00* (2013.01); *G03F 7/2018* (2013.01); *G03F 7/22* (2013.01); *G03F 9/00* (2013.01)

(58) Field of Classification Search
CPC ..... G03F 7/00; G03F 9/00; G03F 7/22; G03F 7/2018; G03F 1/00; H01L 21/0274
USPC .............................................. 430/5
See application file for complete search history.

(56) References Cited

U.S. PATENT DOCUMENTS

| | | | |
|---|---|---|---|
| 2003/0138707 A1* | 7/2003 | Dieu ........................ | G03F 1/26 430/5 |
| 2016/0071726 A1 | 3/2016 | Mizuno et al. | |
| 2018/0040498 A1* | 2/2018 | Huang ................ | H05K 3/1233 |
| 2019/0248073 A1 | 8/2019 | Afshar Mohajer et al. | |

OTHER PUBLICATIONS

MicroFab Technologies, Inc., 3D Microfabrication, URL: http://www.microfab.com/, Printed Jul. 6, 2020, 1 page.
Nanoscribe, 3D Microfabrication, URL: https://www.nanoscribe.com/en/applications, Printed Jul. 6, 2020, 1 page.

* cited by examiner

*Primary Examiner* — Caleen O Sullivan
(74) *Attorney, Agent, or Firm* — Suiter Swantz pc llo

(57) ABSTRACT

Systems and methods for custom photolithography masking via a precision dispense apparatus and process are disclosed. Methods include creating a toolpath instruction for depositing opaque onto a substrate, programming a precision dispense apparatus to execute the created toolpath instruction, and causing the precision dispense tool to deposit opaque material onto the substrate to form the photomask. The substrate may be an optically transparent plate or film or may be an electronic substrate where the opaque material is deposited directly onto a photoresist coating. Capabilities of the systems and methods disclosed herein extend to 3D substrates and custom photolithography masking, among others.

12 Claims, 4 Drawing Sheets

CUSTOM PHOTOLITHOGRAPHY MASKING VIA PRECISION DISPENSE PROCESS

TECHNICAL FIELD

The subject matter disclosed herein is directed generally to microelectronic device fabrication and more particularly to custom photolithography masking via a precision dispense tool.

BACKGROUND

Photolithography masks and processes are used in the fabrication of microelectronic devices, for instance integrated circuit (IC) packages. A photolithography mask, i.e., photomask, is an opaque plate or film having transparent areas that allow ultraviolet (UV) light to pass through in a defined pattern. Used in conjunction with a photosensitive chemical photoresist deposited on a substrate of interest, the pattern defined by the photomask can be physically masked by the cured photoresist material. This allows for material etching or deposition in the defined pattern on the substrate.

Despite their effectiveness, photolithography masks are expensive, have significant lead times, and have very specific use cases, i.e., each application process requires a custom photomask. In addition, current photomask technology is limited to two-dimensional (2D) patterns. Further, it is not uncommon for a design to change thereby requiring a new mask for each minor change. Finally, when die are processed in reconstituted wafers they are often misaligned due to the molding process. Therefore, a photomask designed for a 'perfect' reconstituted wafer often cannot accommodate devices that are imperfectly placed in reconstituted wafers.

Accordingly, what is needed are systems and methods for custom photolithography masking which eliminate the challenges associated with conventional photomasks, and which expand masking capabilities beyond 2D patterns.

SUMMARY

A method for fabricating a photolithography mask via a precision dispense process and apparatus is disclosed. In embodiments, the method includes providing a substrate having an optically transparent region, providing a precision dispense apparatus having a precision dispense tool with programmable toolpath capability and precise material deposition control, creating a toolpath instruction corresponding to a mask pattern, programming the precision dispense apparatus to execute the created toolpath instruction, and creating a photolithography mask by depositing opaque material onto a surface of the optically transparent substrate via the precision dispense tool according to the programmed toolpath instruction.

A method for depositing a photolithography mask directly on an electronic substrate via a precision dispense process and apparatus is also disclosed. In embodiments, the method includes providing an electronic substrate having a region to be masked, providing a precision dispense apparatus having a precision dispense tool with programmable toolpath capability and precise material deposition control, creating a toolpath instruction corresponding to a predetermined mask pattern, programming the precision dispense apparatus to execute the created toolpath instruction, and fabricating a photomask directly on at least one surface of the electronic substrate by depositing opaque material onto the at least one surface of the electronic substrate via the precision dispense tool according to the programmed toolpath instruction.

A computer-aided system for fabricating a photolithography mask via a precision dispense process and apparatus is also disclosed. In embodiments, the system includes a precision dispense apparatus including a precision dispense tool having programmable toolpath capability and precise material deposition control, and a toolpath creation system for creating a toolpath instruction to be executed by the precision dispense tool to fabricate a photolithography mask in a predetermined pattern by depositing opaque material onto an optically transparent substrate or directly onto at least one surface of a photoresist-coated electronic substrate, according to the created toolpath instruction.

The method and system embodiments according to the present disclosure obviate the need for conventional photomask fabrication, and in some implementations obviate the need for a photomask entirely, thereby reducing the costs associated with microelectronic device fabrication and facilitating fabrication of more advanced microelectronic device designs, among other capabilities and advantages.

This Summary is provided solely as an introduction to subject matter that is fully described in the Detailed Description and Drawings. The Summary should not be considered to describe essential features nor be used to determine the scope of the Claims. Moreover, it is to be understood that both the foregoing Summary and the following Detailed Description are exemplary and explanatory only and are not necessarily restrictive of the subject matter claimed.

BRIEF DESCRIPTION OF THE DRAWINGS

The detailed description is described with reference to the accompanying figures. The use of the same reference numbers in different instances in the description and the figures may indicate similar or identical items. Various embodiments or examples ("examples") of the present disclosure are disclosed in the following detailed description and the accompanying drawings. The drawings are not necessarily to scale. In general, operations of disclosed processes may be performed in an arbitrary order, unless otherwise provided in the claims. In the drawings:

DETAILED DESCRIPTION

Figure 1A:
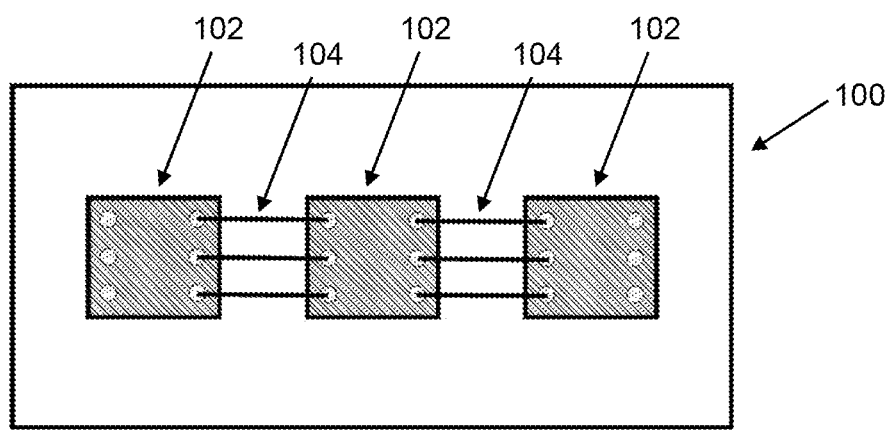
FIG. 1A illustrates expected photo-definable features, e.g., die, and interconnect to be made in a reconstituted wafer in accordance with an example embodiment of this disclosure.

Before explaining one or more embodiments of the disclosure in detail, it is to be understood that the embodiments are not limited in their application to the details of construction and the arrangement of the components or steps or methodologies set forth in the following description or illustrated in the drawings. In the following detailed description of embodiments, numerous specific details may be set forth in order to provide a more thorough understanding of the disclosure. However, it will be apparent to one of ordinary skill in the art having the benefit of the instant disclosure that the embodiments disclosed herein may be practiced without some of these specific details. In other instances, well-known features may not be described in detail to avoid unnecessarily complicating the instant disclosure.

As used herein a letter following a reference numeral is intended to reference an embodiment of the feature or element that may be similar, but not necessarily identical, to a previously described element or feature bearing the same reference numeral (e.g., 1, 1a, 1b). Such shorthand notations are used for purposes of convenience only and should not be construed to limit the disclosure in any way unless expressly stated to the contrary.

Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of "a" or "an" may be employed to describe elements and components of embodiments disclosed herein. This is done merely for convenience and "a" and "an" are intended to include "one" or "at least one," and the singular also includes the plural unless it is obvious that it is meant otherwise.

Finally, as used herein any reference to "one embodiment" or "some embodiments" means that a particular element, feature, structure, or characteristic described in connection with the embodiment is included in at least one embodiment disclosed herein. The appearances of the phrase "in some embodiments" in various places in the specification are not necessarily all referring to the same embodiment, and embodiments may include one or more of the features expressly described or inherently present herein, or any combination or sub-combination of two or more such features, along with any other features which may not necessarily be expressly described or inherently present in the instant disclosure.

With reference to the drawing figures, the present disclosure provides systems and methods for fabricating custom photomasks and/or for depositing photomasking materials directly onto a substrate, for instance an electronic substrate, for custom photolithography processes. Photomasking fabrication methods according to the present disclosure can be used to fabricate original photomasks or modify existing photomasks fabricated by conventional processes or by the methods according to the present disclosure. Capabilities of the present disclosure extend to substrates including three-dimensional (3D) surface features and post-build processing, among other capabilities.

Figure 1B:
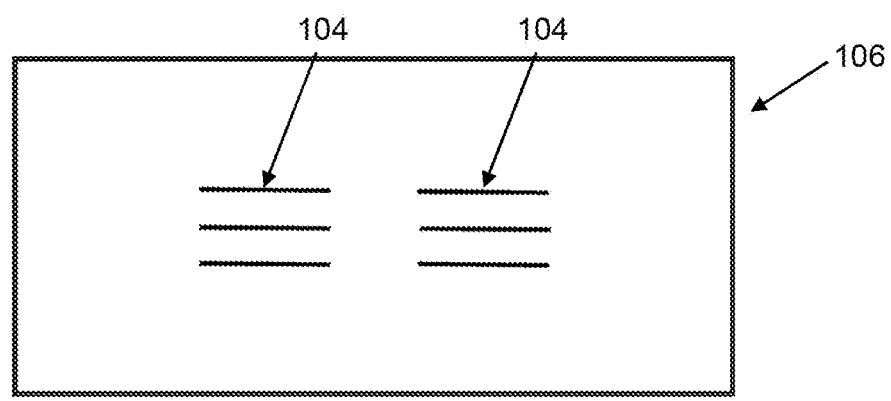
FIG. 1B illustrates the photomask pattern to accommodate the expected interconnect for the expected device alignment of FIG. 1A.

FIGS. 1A through 1D illustrate a non-limiting example of the methods according to the present disclosure being implemented to fabricate a custom photomask for patterning features onto a microelectronic device package, for instance a reconstituted wafer being used to embed a plurality of devices. FIG. 1A illustrates a substrate 100 and the expected photo-definable devices 102, e.g., die, and interconnect 104 to be made in the substrate 100 to fabricate a 'perfect' package. The devices 102 are expected to be properly aligned such that the final reconstituted package has the three devices connected with the interconnect 104 parallel as shown. FIG. 1B illustrates the photomask 106 for the 'perfect' package having the parallel interconnect 104 patterning corresponding to the expected interconnect 104 shown in FIG. 1A.

Figure 1C:
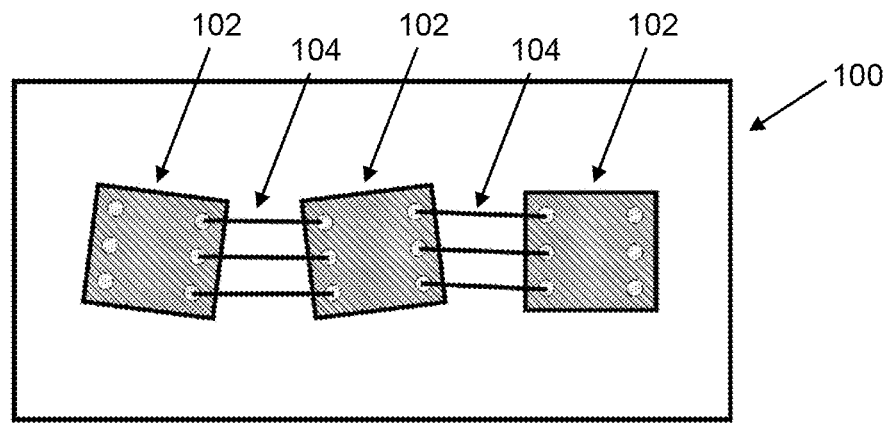
FIG. 1C illustrates the actual misaligned device positions and necessary interconnect to render the connections functional.
Figure 1D:
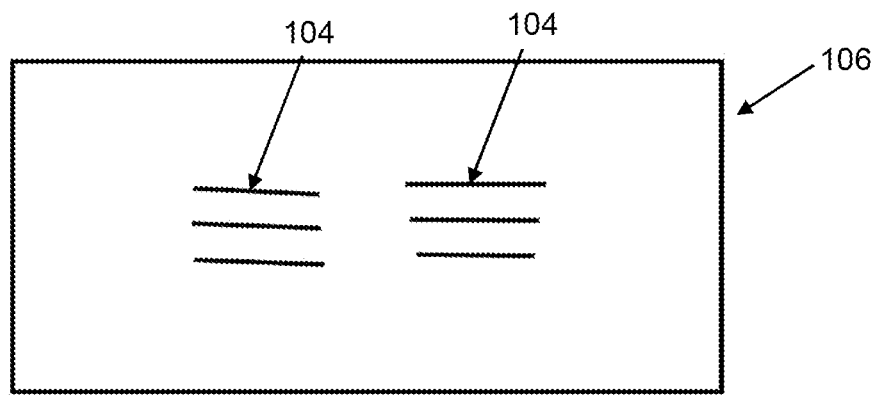
FIG. 1D illustrates the photomask pattern needed to accommodate the actual misaligned device positions of FIG. 1C.

FIG. 1C illustrates the substrate 100 and the actual photo-definable devices 102 and interconnect 104 necessary to fabricate a functional 'imperfect' reconstituted wafer. As shown, the package can still function provided the locations on each device 102 are connected. As evident from FIGS. 1A and 1C, the actual devices 102 are misaligned as shown in FIG. 1C and therefore require custom angled and variable-length interconnect to render the package functional. Therefore, in this case the expected photomask shown in FIG. 1B could not be used to define the locations for the interconnect to be deposited as shown in FIG. 1C. Instead, a photomask such as the custom photomask shown in FIG. 1D is required to accommodate the improper device alignment. The custom photomask shown in FIG. 1D can be fabricated according to the precision dispense methods disclosed herein.

A first precision dispense method according to the present disclosure can be used to fabricate a custom photomask used in a photolithography process, for instance the photomask shown in FIG. 1D. In a first step, the method includes providing a photomask substrate having an optically transparent portion, for instance an optically transparent plate or film used in conventional photomask fabrication. The substrate is optically transparent such that light, e.g., ultraviolet (UV) light, can shine through the photomask to expose unmasked portions of the substrate, for instance a photoresist coating layer.

A second step of the first method includes providing a precision dispense apparatus having a precision dispense tool with programmable toolpath capability, precise material deposition control, and optionally visioning/alignment capability. For example, the precision dispense apparatus may be suitable for depositing opaque materials in lines as small as 10 microns wide reliably, for example line widths between 10 microns and 100 microns. The apparatus includes a precision dispense tool such as a nozzle for being directed at the substrate, a control module for automated control of process parameters, and a motion control module that drives multi-axis translation stages. In use, the precision dispense tool may be translated under computer control while the substrate position remains fixed, or vice-versa. Opaque materials are not limited to any one type and may be chosen based on the composition of the substrate, among other parameters.

Dispensed opaque material may be controlled via a volume control process. For example, the opaque material may exit the precision dispense tool through an orifice directed at the substrate in a stream as small as, for example, a few microns. The diameter of the dispensed stream may be controlled by the orifice size, flowrate, and spacing between the orifice and the substrate. The precision dispense tool may be configured to move in different orthogonal directions parallel to or perpendicular to horizontal and under computer control via linear stages and a motion control module.

Figure 2A:
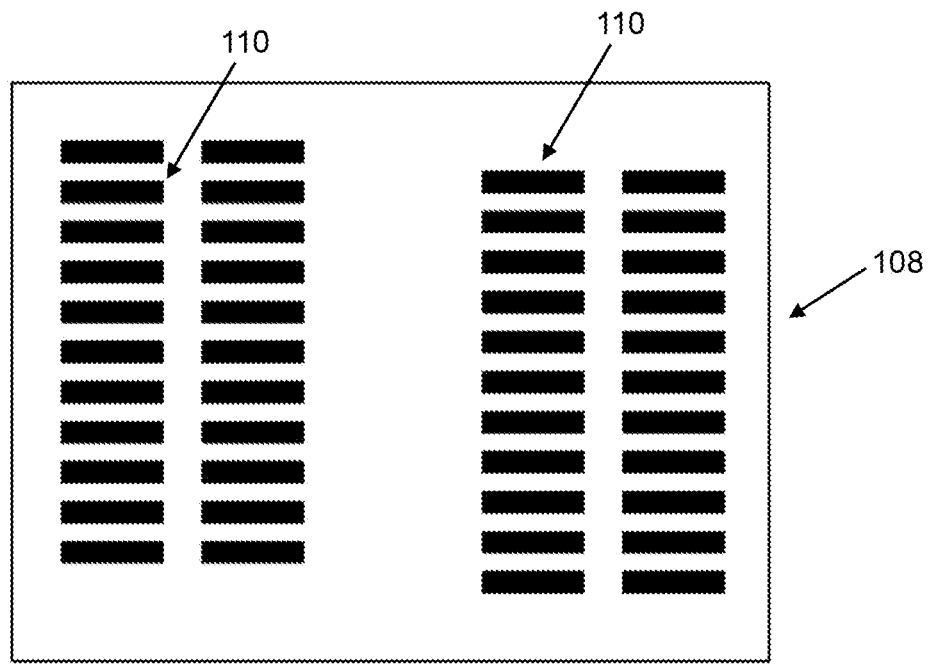
FIG. 2A illustrates an original photomask including disconnected photo-defined features.
Figure 2B:
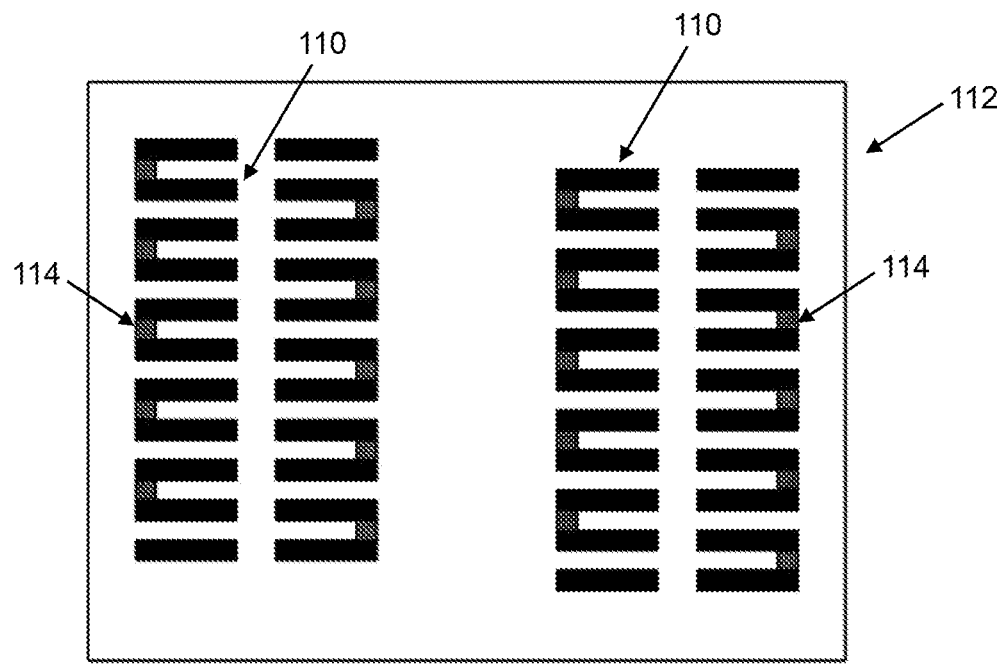
FIG. 2B illustrates opaque material deposited to connect the photo-defined features of the photomask of FIG. 2B to provide a customized photomask.

A third step of the first method includes creating a toolpath instruction corresponding to a photomask pattern. The photomask pattern may be an original pattern, a pattern to accommodate alignment issues, a pattern to accommodate a design change, etc. For example, FIG. 1D illustrated a custom photomask pattern to accommodate for the alignment issues as a result of the imperfect device alignment illustrated in FIG. 1C. FIG. 2A illustrates an 'original' photomask 108 having 'original' photo-defined opaque features 110 shown disconnected, wherein the photomask may have been made by a conventional photomask fabrication process or by a precision deposition process according to the present disclosure. FIG. 2B illustrates a customized photomask 112 in which additional opaque features 114 are deposited to connect the original opaque features 110, for example to accommodate a design change.

A fourth step of the first method includes programming the precision dispense apparatus to execute the created toolpath instruction, which may include one or more of precision dispense tool movement control and precision dispense volume control. Known to those skilled in the art of computer numerical control (CNC), the precision dispense apparatus may operate to automate the control of the precision dispense tool via a computer to meet the specifications of the coded instructions of the toolpath without a manual operator. The created toolpath instructions may be delivered to the precision dispense apparatus in the form of a sequential program of machine control instructions such as G-code generated by computer-aided design (CAD) software. Controls including, but not limited to, material flow rate, precision dispense tool velocity, and precision dispense tool spacing above the substrate may be based on at least one predetermined parameter corresponding to at least one of the opaque material, substrate material, etc.

A final step of the first method incudes causing the precision dispense tool to deposit opaque material onto the optically transparent portion according to the programmed toolpath instruction to fabricate a custom photomask.

A second method according to the present disclosure can be used deposit material directly onto a substrate to act as a physical making material. In a first step, the method includes providing a substrate to be masked. For example, the substrate may be an electronic substrate such as a microelectronic device package layer, for instance an integrated circuit (IC) package layer. In some embodiments, the substrate may be a photosensitive photoresist coated on the electronic substrate upon which electronic devices are embedded and functional circuitry fabricated. In some embodiments, the substrate may be fashioned of silicon or any other suitable semiconducting material. The substrate surface may be two-dimensional (2D), or may be three-dimensional (3D) by its shape, e.g., curved, or inclusion of 3D features. The second, third, fourth and final steps according to the second method of the present disclosure may be similar or equivalent to the corresponding steps according to the first method. As such, the second through final steps are not repeated herein.

Figure 3A:
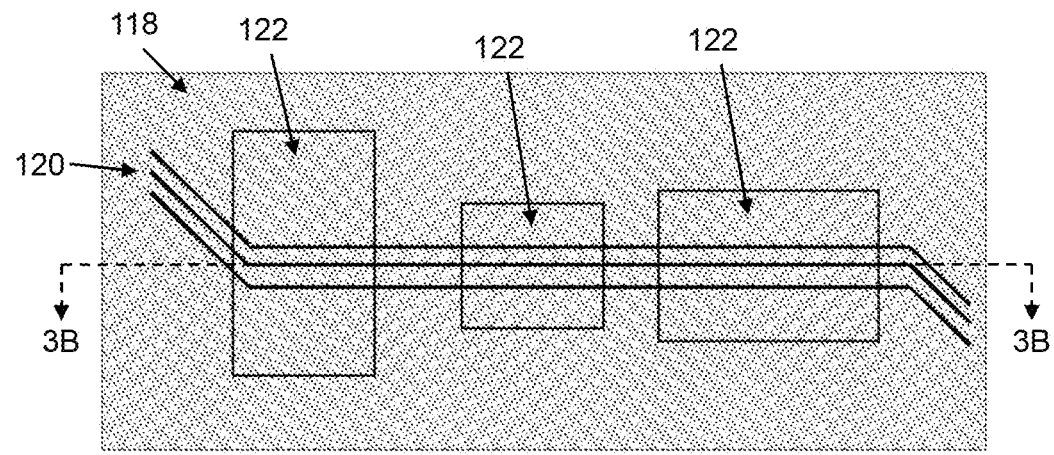
FIG. 3A is a top view of a photoresist coated substrate including three-dimensional (3D) surface features and deposited opaque masking material.
Figure 3B:
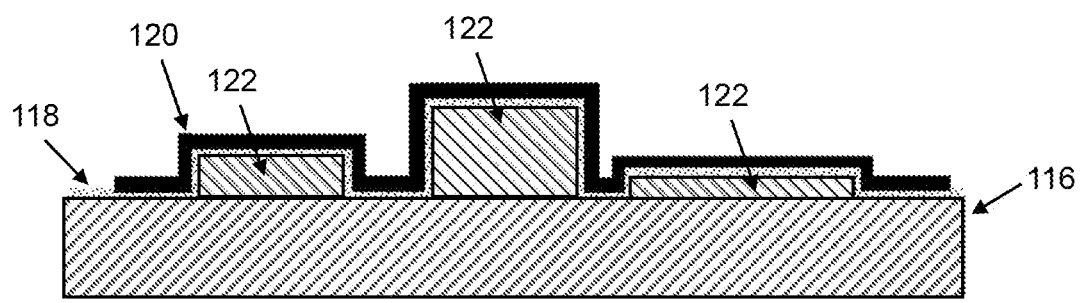
FIG. 3B is cross section of the substrate of FIG. 3A taken along line 3B-3B of FIG. 3A.

However, an additional capability of the second method extends to directly depositing the masking material on three-dimensional (3D) substrates and/or post-build processing. For example, as illustrated in FIGS. 3A and 3B, the substrate 116 may be coated in a photoresist material 118. Then, the precision dispense process according to methods disclosed herein used to deposit opaque material 120 on the base substrate features and on all the 3D features 122. The photoresist can then be exposed and cured in the regions not covered by the opaque material, i.e., the unmasked regions.

It is to be understood that embodiments of the methods disclosed herein may include one or more of the steps described herein. Further, such steps may be carried out in any desired order and two or more of the steps may be carried out simultaneously with one another. Two or more of the steps disclosed herein may be combined in a single step, and in some embodiments, one or more of the steps may be carried out as two or more sub-steps. Further, other steps or sub-steps may be carried in addition to, or as substitutes to one or more of the steps disclosed herein.

Although inventive concepts have been described with reference to the embodiments illustrated in the attached drawing figures, equivalents may be employed and substitutions made herein without departing from the scope of the claims. Components illustrated and described herein are merely examples of a system/device and components that may be used to implement embodiments of the inventive concepts and may be replaced with other devices and components without departing from the scope of the claims. Furthermore, any dimensions, degrees, and/or numerical ranges provided herein are to be understood as non-limiting examples unless otherwise specified in the claims.

What is claimed is:

1. A method for fabricating a photolithography mask, comprising:

providing a substrate comprising an optically transparent portion;

providing a precision dispense apparatus including a precision dispense tool with programmable toolpath capability and precise material deposition control;

creating a toolpath instruction corresponding to a mask pattern;

programming the precision dispense apparatus to execute the created toolpath instruction; and causing the precision dispense tool to deposit opaque material onto the optically transparent portion according to the programmed toolpath instruction to fabricate a photomask, wherein the opaque material is deposited as one or more lines each having a line width from 10 microns to 100 microns.

2. The method according to claim 1, wherein the created toolpath instruction comprises:

a movement component for controlling movement of the precision dispense tool along at least two different orthogonal directions; and a deposition control component for controlling a volume of the opaque material dispensed by the precision dispense tool.

3. The method according to claim 1, wherein the substrate comprising the optically transparent portion, prior to the step of causing the precision dispense tool to deposit opaque material onto the optically transparent portion, further comprises an opaque portion corresponding to a masking pattern, and wherein the opaque portion and the deposited opaque material together form the mask pattern.

4. The method according to claim 1, wherein the substrate is a plate or film.

5. A method for depositing a photolithography mask directly on an electronic substrate, comprising:

providing an electronic substrate to be pattern masked, the electronic substrate comprising a photoresist surface coating;

providing a precision dispense apparatus including a precision dispense tool with programmable toolpath capability and precise material deposition control;

creating a toolpath instruction corresponding to a predetermined mask pattern;

programming the precision dispense apparatus to execute the created toolpath instruction; and causing the precision dispense tool to deposit opaque material directly onto the photoresist surface coating according to the programmed toolpath instruction.

6. The method according to claim 5, wherein the created toolpath instruction comprises:

a movement component for controlling movement of the precision dispense tool along at least two different orthogonal directions; and a deposition control component for controlling a volume of the opaque material dispensed by the precision dispense tool.

7. The method according to claim 5, wherein the electronic substrate comprises at least one three-dimensional (3D) surface feature, and wherein the photoresist surface coating coats the entire surface of the electronic substrate including the at least one 3D surface feature, and wherein the opaque material is deposited onto the photoresist surface coating over the at least one 3D surface features and portions of the electronic substrate adjacent the at least one 3D surface feature.

8. The method according to claim 7, wherein the at least one 3D surface feature is an embedded device.

9. The method according to claim 5, wherein the opaque material is deposited as one or more lines each having a line width from 10 microns to 100 microns.

10. A computer-aided system for fabricating a photomask, comprising:

a precision dispense apparatus including a precision dispense tool having programmable toolpath capability and precise material deposition control; and a toolpath creation system for creating a toolpath instruction to be executed by the precision dispense tool to fabricate a photomask by depositing opaque material onto a substrate according to the created toolpath instruction, wherein the substrate comprises at least one three-dimensional (3D) surface feature.

11. The system according to claim 10, wherein the substrate is a plate or film comprising an optically transparent portion.

12. The system according to claim 10, wherein the substrate is an electronic substrate comprising a photoresist surface coating, and wherein the opaque material is to be deposited directly onto the surface coating.

* * * * *